US012570933B2

(12) United States Patent
Tano

(10) Patent No.: US 12,570,933 B2
(45) Date of Patent: Mar. 10, 2026

(54) COMPOSITION FOR SEMICONDUCTOR PROCESSING AND PROCESSING METHOD

(71) Applicant: JSR CORPORATION, Tokyo (JP)

(72) Inventor: Hiroyuki Tano, Tokyo (JP)

(73) Assignee: JSR CORPORATION, Tokyo (JP)

( * ) Notice: Subject to any disclaimer, the term of this patent is extended or adjusted under 35 U.S.C. 154(b) by 296 days.

(21) Appl. No.: 18/460,625

(22) Filed: Sep. 4, 2023

(65) Prior Publication Data

US 2024/0150680 A1 May 9, 2024

(30) Foreign Application Priority Data

Oct. 19, 2022 (JP) ................................ 2022-167495

(51) Int. Cl.

| | |
|---|---|
| ***C11D 3/26*** | (2006.01) |
| ***B08B 3/08*** | (2006.01) |
| ***C11D 3/20*** | (2006.01) |
| ***C11D 3/28*** | (2006.01) |
| ***C11D 3/30*** | (2006.01) |
| ***C11D 7/26*** | (2006.01) |
| ***C11D 7/32*** | (2006.01) |
| ***C11D 7/50*** | (2006.01) |
| ***G03F 7/42*** | (2006.01) |
| ***H01L 21/02*** | (2006.01) |

(52) U.S. Cl.

CPC ................ *C11D 7/263* (2013.01); *B08B 3/08* (2013.01); *C11D 3/201* (2013.01); *C11D 3/2068* (2013.01); *C11D 3/26* (2013.01); *C11D 3/28* (2013.01); *C11D 7/261* (2013.01); *C11D 7/264* (2013.01); *C11D 7/3209* (2013.01); *C11D 7/3218* (2013.01); *C11D 7/3281* (2013.01); *C11D 7/5022* (2013.01); *G03F 7/42* (2013.01); *H01L 21/02057* (2013.01); *C11D 2111/22* (2024.01)

(58) Field of Classification Search

CPC ......... C11D 3/201; C11D 3/2068; C11D 3/26; C11D 3/28; C11D 7/261; C11D 7/263; C11D 7/3209; C11D 7/3218

USPC ....... 510/175, 176, 178, 477, 488, 499, 500, 510/505, 506

See application file for complete search history.

(56) References Cited

U.S. PATENT DOCUMENTS

| | | | | |
|---|---|---|---|---|
| 2004/0048761 | A1* | 3/2004 | Ikemoto | G03F 7/425 510/176 |
| 2004/0081922 | A1* | 4/2004 | Ikemoto | G03F 7/425 510/176 |
| 2006/0270574 | A1* | 11/2006 | Ikemoto | G03F 7/426 510/176 |
| 2017/0253840 | A1* | 9/2017 | Goto | C11D 7/08 |
| 2020/0199500 | A1* | 6/2020 | White | C09K 13/00 |

FOREIGN PATENT DOCUMENTS

| | | | |
|---|---|---|---|
| JP | 2007328338 | 12/2007 | |
| JP | 2012033774 | 2/2012 | |
| WO | WO-2011012559 A2 * | 2/2011 | G03F 7/425 |
| WO | WO-2016011331 A1 * | 1/2016 | C11D 7/10 |
| WO | WO-2019083643 A1 * | 5/2019 | B08B 3/10 |

OTHER PUBLICATIONS

"Office Action of Taiwan Counterpart Application", issued on Oct. 13, 2023, with English translation thereof, p. 1-p. 8.

* cited by examiner

*Primary Examiner* — Gregory R Delcotto
(74) *Attorney, Agent, or Firm* — JCIPRNET

(57) ABSTRACT

A composition for semiconductor processing according to the disclosure contains (A) a compound represented by the following general formula (1), (B) a compound represented by the following general formula (2), (C) a compound having at least one functional group selected from the group consisting of an amino group and a salt thereof and a hydroxyl group (excluding the compound represented by the following general formula (1), a compound having a carboxyl group and a nitrogen-containing heterocyclic compound) and (D) a liquid medium, and, when the content of the (A) component is indicated by $M_A$ [mass %] and the content of the (B) component is indicated by $M_B$ [mass %], $M_A/M_B$ is $1.0\times10^2$ to $1.0\times10^4$.

$$R_2N(OH) \quad (1)$$

$$R_2NH \quad (2)$$

(In the formula (1) and the formula (2), R's each independently represent an alkyl group having 1 to 4 carbon atoms).

12 Claims, No Drawings

COMPOSITION FOR SEMICONDUCTOR PROCESSING AND PROCESSING METHOD

CROSS-REFERENCE TO RELATED APPLICATION

This application claims the priority benefit of Japan application serial no. 2022-167495, filed on Oct. 19, 2022. The entirety of the above-mentioned patent application is hereby incorporated by reference herein and made a part of this specification.

BACKGROUND

Technical Field

The disclosure relates to a composition for semiconductor processing and a processing method using the same.

Description of Related Art

A semiconductor element is manufactured by forming a fine electronic circuit pattern on a substrate using a photolithography technique. For example, a semiconductor element is manufactured by performing a photolithography step of forming a resist film on a laminate including a metal layer, which serves as a wiring material, an etching-stop layer, an interlayer insulating film and the like on a substrate and exposing and subsequently developing the resist film in a pattern shape to form a pattern and a dry etching step in which plasma etching and plasma ashing are combined. After the photolithography step, there is a need to remove the resist film formed on the laminate. In addition, after the dry etching step, there is a need to remove a residue attached after the processing.

As a technique for removing the resist film after the photolithography step, there has been a proposal of a method in which a composition containing an organic solvent as a main component is used (for example, refer to Patent Document 1: Japanese Patent Laid-Open No. 2007-328338). In addition, as a technique for removing the residue after the dry etching step, there has been a proposal of a method in which a cleaning composition containing hydroxylamine is used (for example, refer to Patent Document 2: Japanese Patent Laid-Open No. 2012-033774).

PATENT DOCUMENTS

In such methods, it is usual that the compositions are heated to 50° C. to 65° C. immediately before use and used in order to efficiently remove the resist film or the residue. On the other hand, at the time of commercial manufacturing, these compositions are stored at near room temperature in many cases. However, usually, a composition for semiconductor processing contains a plurality of chemical substances having different properties, and components in the composition for semiconductor processing are likely to alter due to a reaction caused by heating or long-term storage. Therefore, it is difficult to maintain the processing characteristics of the composition for semiconductor processing, and there has been a need to further improve the storage stability of the composition for semiconductor processing in order to improve the manufacturing yield of semiconductor elements.

Several aspects according to the disclosure provide a composition for semiconductor processing capable of maintaining favorable processing characteristics even after being stored for a predetermined period and, furthermore, capable of improving the manufacturing yield of semiconductor elements and a processing method using the same by solving at least a part of the above-described problems to improve the storage stability.

SUMMARY

An aspect of a composition for semiconductor processing according to the present disclosure contains (A) a compound represented by the following general formula (1), (B) a compound represented by the following general formula (2), (C) a compound having at least one functional group selected from the group consisting of an amino group and a salt thereof and a hydroxyl group (excluding the compound represented by the following general formula (1), a compound having a carboxyl group and a nitrogen-containing heterocyclic compound), and (D) a liquid medium, in which, when a content of the (A) component is indicated by $M_A$ [mass %] and a content of the (B) component is indicated by $M_B$ [mass %], $M_A/M_B$ is $1.0\times10^2$ to $1.0\times10^4$.

$$R_2N(OH) \quad (1)$$

$$R_2NH \quad (2)$$

(In the formula (1) and the formula (2), R's each independently represent an alkyl group having 1 to 4 carbon atoms.)

An aspect of a processing method according to the disclosure includes a step of processing a semiconductor substrate using the composition for semiconductor processing according to any of the aspects.

An aspect of a processing method according to the disclosure includes a step of supplying the composition for semiconductor processing according to any of the aspects having a temperature of 25° C. or higher and 65° C. or lower while a semiconductor substrate is rotated at 300 rpm or faster and 1000 rpm or slower at a supply rate of the composition for semiconductor processing of 500 mL/minute or faster and 1500 mL/minute or slower for a supply time of the composition for semiconductor processing of 30 seconds or longer and 300 seconds or shorter to be brought into contact with the semiconductor substrate.

DESCRIPTION OF THE EMBODIMENTS

An aspect of a composition for semiconductor processing according to the present disclosure contains (A) a compound represented by the following general formula (1), (B) a compound represented by the following general formula (2), (C) a compound having at least one functional group selected from the group consisting of an amino group and a salt thereof and a hydroxyl group (excluding the compound represented by the following general formula (1), a compound having a carboxyl group and a nitrogen-containing heterocyclic compound), and (D) a liquid medium, in which, when a content of the (A) component is indicated by $M_A$ [mass %] and a content of the (B) component is indicated by $M_B$ [mass %], $M_A/M_B$ is $1.0\times10^2$ to $1.0\times10^4$.

$$R_2N(OH) \quad (1)$$

$$R_2NH \quad (2)$$

(In the formula (1) and the formula (2), R's each independently represent an alkyl group having 1 to 4 carbon atoms.)

In an aspect of the composition for semiconductor processing, the (C) component may be at least one selected from the group consisting of methanolamine, ethanolamine, isopropanolamine and diethylethanolamine.

In an aspect of the composition for semiconductor processing, the (D) component may be an aqueous medium.

In an aspect of the composition for semiconductor processing, a nitrogen-containing heterocyclic compound may be further contained.

An aspect of a processing method according to the disclosure includes a step of processing a semiconductor substrate using the composition for semiconductor processing according to any of the aspects.

An aspect of a processing method according to the disclosure includes a step of supplying the composition for semiconductor processing according to any of the aspects having a temperature of 25° C. or higher and 65° C. or lower while a semiconductor substrate is rotated at 300 rpm or faster and 1000 rpm or slower at a supply rate of the composition for semiconductor processing of 500 mL/minute or faster and 1500 mL/minute or slower for a supply time of the composition for semiconductor processing of 30 seconds or longer and 300 seconds or shorter to be brought into contact with the semiconductor substrate.

According to the composition for semiconductor processing according to the disclosure, since the storage stability improves, it is possible to maintain favorable processing characteristics even after the composition is stored for a predetermined period and, furthermore, to improve the manufacturing yield of semiconductor elements.

Hereinafter, a preferable embodiment of the disclosure will be described in detail. The disclosure is not limited to the embodiment described below and also includes a variety of modification examples performed within the scope of the gist of the disclosure.

1. Composition for Semiconductor Processing

A composition for semiconductor processing according to an embodiment of the disclosure contains (A) a compound represented by the following general formula (1) (in the present specification, also referred to as "(A) component"), (B) a compound represented by the following general formula (2) (in the present specification, also referred to as "(B) component"), (C) a compound having at least one functional group selected from the group consisting of an amino group and a salt thereof and a hydroxyl group (excluding the compound represented by the following general formula (1), a compound having a carboxyl group and a nitrogen-containing heterocyclic compound) (in the present specification, also referred to as "(C) component") and (D) a liquid medium (in the present specification, also referred to as "(D) component"), and, when the content of the (A) component is indicated by $M_A$ [mass %] and the content of the (B) component is indicated by $M_B$ [mass %], $M_A/M_B$ is $1.0\times10^2$ to $1.0\times10^4$.

$$R_2N(OH) \quad (1)$$

$$R_2NH \quad (2)$$

(In the formula (1) and the formula (2), R's each independently represent an alkyl group having 1 to 4 carbon atoms.)

The composition for semiconductor processing according to the present embodiment may be a concentrated type intended to be used after being diluted with a liquid medium such as pure water or an organic solvent or may be an undiluted type intended to be used as it is without being diluted. In the present specification, in the case of being not specified as a concentrated type or an undiluted type, the term "composition for semiconductor processing" is interpreted as a concept including both of the concentrated type and the undiluted type.

In addition, the composition for semiconductor processing according to the present embodiment can be used as a processing agent such as a cleaning agent for removing a particle, a metal impurity or the like present on the surface of an object to be processed after the end of a chemical mechanical polishing (hereinafter, also referred to as "CMP") step, a resist removal agent for removing a resist film from a semiconductor substrate processed using a resist, a cleaning agent for removing a residue after a dry etching step or an etching agent for removing surface contamination by shallowly etching the surface of a metal wiring or the like.

That is, "processing agent" in the present specification refers to a liquid agent that is an agent prepared by diluting the concentrated type composition for semiconductor processing by adding a liquid medium thereto or the undiluted type composition for semiconductor processing itself and is actually used at the time of processing an object to be processed. In the concentrated type composition for semiconductor processing, normally, each component is present in a concentrated state. Therefore, each user is able to prepare a processing agent by diluting the concentrated type composition for semiconductor processing with a liquid medium or use the undiluted type composition for semiconductor processing as it is and use the processing agent as a cleaning agent for cleaning the surface of an object to be processed after the end of a CMP step, a resist removal agent, a cleaning agent for residue removal or an etching agent. Hereinafter, each component that is contained in the composition for semiconductor processing according to the present embodiment will be described in detail.

1.1 (A) Component

The composition for semiconductor processing according to the present embodiment contains (A) a compound represented by the following general formula (1).

$$R_2N(OH) \quad (1)$$

(In the formula (1), R's each independently represent an alkyl group having 1 to 4 carbon atoms.)

In the formula (1), the two R's may be the same groups or may be different groups, but are preferably the same groups. In addition, R is preferably the same group as R in the formula (2). R is an alkyl group having 1 to 4 carbon atoms, preferably a methyl group or an ethyl group and more preferably an ethyl group.

The lower limit value of the content of the (A) component is preferably 0.1 mass %, more preferably 0.5 mass % and particularly preferably 1 mass % when the total mass of the composition for semiconductor processing is set to 100 mass %. On the other hand, the upper limit value of the content of the (A) component is preferably 20 mass %, more preferably 15 mass % and particularly preferably 10 mass % when the total mass of the composition for semiconductor processing is set to 100 mass %. When the content of the (A) component is within the above-described range, it is possible to exhibit favorable processing characteristics and, furthermore, to maintain favorable processing characteristics even after the composition is stored for a predetermined period.

1.2. (B) Component

The composition for semiconductor processing according to the present embodiment contains (B) a compound represented by the following general formula (2).

$$R_2NH \quad (2)$$

(In the formula (2), R's each independently represent an alkyl group having 1 to 4 carbon atoms.)

In the formula (2), the two R's may be the same groups or may be different groups, but are preferably the same groups. In addition, R is preferably the same group as R in the formula (1). R is an alkyl group having 1 to 4 carbon atoms, preferably a methyl group and an ethyl group and more preferably an ethyl group.

The lower limit value of the content of the (B) component is preferably 0.00005 mass %, more preferably 0.0001 mass % and particularly preferably 0.0002 mass % when the total mass of the composition for semiconductor processing is set to 100 mass %. On the other hand, the upper limit value of the content of the (B) component is preferably 0.2 mass %, more preferably 0.1 mass % and particularly preferably 0.05 mass % when the total mass of the composition for semiconductor processing is set to 100 mass %. When the content of the (B) component is within the above-described range, it is possible to exhibit favorable processing characteristics and, furthermore, to maintain favorable processing characteristics even after the composition is stored for a predetermined period.

1.3. Content Ratio Between (A) Component and (B) Component

When the content of the (A) component in the composition for semiconductor processing according to the present embodiment is indicated by $M_A$ [mass %], and the content of the (B) content is indicated by $M_B$ [mass %], the lower limit value of the value of $M_A/M_B$ is preferably $1.0\times10^2$, more preferably to $1.3\times10^2$ and particularly preferably $1.5\times10^2$. The upper limit value of the value of $M_A/M_B$ is preferably $1.0\times10^4$, more preferably $9.0\times10^3$ and particularly preferably $8.5\times10^3$.

In the composition for semiconductor processing according to the present embodiment, when the value of $M_A/M_B$, which is the content ratio between the (A) component and the (B) component, is within the above-described range, deterioration of the composition for semiconductor processing is suppressed, and the manufacturing yield of semiconductor elements can be improved. On the other hand, when the value of $M_A/M_B$ exceeds the above-described range, deterioration of the composition for semiconductor processing is likely to progress during the heating and use of the composition, and stable processing characteristics cannot be maintained, which is not preferable.

1.4 (C) Component

The composition for semiconductor processing according to the present embodiment contains (C) a compound having at least one functional group selected from the group consisting of an amino group and a salt thereof and a hydroxyl group (excluding the compound represented by the general formula (1), a compound having a carboxyl group and a nitrogen-containing heterocyclic compound). It is conceivable that, when the composition contains the (C) component, in the case of removing a resist film from a semiconductor substrate, it is possible to promote the dissolution of the resist film. In addition, it is conceivable that, in the case of cleaning an object to be processed after the end of CMP, it is possible to effectively remove a metal oxide film (for example, a $CuO$, $Cu_2O$ or $Cu(OH_2)$ layer) or an organic residue (for example, a BTA layer) on the semiconductor substrate by etching. Furthermore, it is conceivable that, in the case of removing a residue after the dry etching step, it is possible to promote the dissolution of the residue and thereby improve removability.

The (C) component is preferably water-soluble. "Being water-soluble" in the present specification refers to the fact that the mass of a substance that dissolves in 100 g of water at 20° C. is 0.1 g or more.

Examples of the (C) component include primary amines such as monoethanolamine, monopropanolamine, monoisopropanolamine, methylamine, ethylamine, propylamine, butylamine, pentylamine and 1,3-propanediamine; secondary amines such as diethanolamine, dipropanolamine, diisopropanolamine, N-methylethanolamine, N-ethylethanolamine and N-(β-aminoethyl)ethanolamine; tertiary amines such as triethanolamine, tripropanolamine, triisopropanolamine, N-methyl-N,N-diethanolamine, N,N-dimethylethanolamine, N,N-diethylethanolamine, N,N-dibutylethanolamine, trimethylamine and triethylamine; quaternary ammonium salts such as tetramethylammonium hydroxide. These (C) components may be used singly or two or more thereof may be used in combination.

Among these (C) components, from the viewpoint of a particularly high effect of removing a resist film on a semiconductor substrate, a compound having a hydroxyl group or a salt of a hydroxide is preferable, at least one selected from the group consisting of methanolamine, ethanolamine, isopropanolamine and diethylethanolamine is preferable, and at least one selected from the group consisting of ethanolamine and isopropanolamine is more preferable.

The lower limit value of the content of the (C) component is preferably 0.01 mass %, more preferably 0.1 mass % and particularly preferably 0.5 mass % when the total mass of the composition for semiconductor processing is set to 100 mass %. On the other hand, the upper limit value of the content of the (C) component is preferably 10 mass %, more preferably 7 mass % and particularly preferably 5 mass % when the total mass of the composition for semiconductor processing is set to 100 mass %. When the content of the (C) component is within the above-described range, performance for removing a resist film or cleaning performance for removing a residue after the dry etching step becomes high, which is preferable.

1.5 (D) Component

The composition for semiconductor processing according to the present embodiment contains (D) a liquid medium as a main component. The (D) component can be selected as appropriate depending on the intended use of the processing agent such as the cleaning of an object to be processed, etching or the removal of a resist film.

As the (D) component, an aqueous medium containing water as a main component is preferable. Examples of such an aqueous medium include water, solvent mixtures of water and an alcohol and solvent mixtures containing water and an organic solvent that is compatible with water. Among these aqueous mediums, water or the solvent mixtures of water and an alcohol are preferably used, and water is more preferably used.

Examples of the organic solvent include well-known organic solvents that can be used in a semiconductor processing step such as polar solvents such as ketone-based solvents, ester-based solvents, ether-based solvents, amide-based solvents, glycol-based solvents and sulfur-containing compound-based solvents and hydrocarbon-based solvents.

Examples of the ketone-based solvents include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone and the like.

The ester-based solvents may be chain ester-based solvents or may be cyclic ester-based solvents. Examples of the chain ester-based solvents include methyl acetate, butyl acetate, ethyl acetate, isopropyl acetate, pentyl acetate, isopentyl acetate, ethyl methoxyacetate, ethyl ethoxyacetate, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxypropionate and the like. In addition, examples of the cyclic ester-based solvents include lactones such as γ-butyrolactone, ethylene carbonate, propylene carbonate and the like.

Examples of the ether-based solvents include glycol ether-based solvents such as ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, propylene glycol monomethyl ether, ethylene glycol dibutyl ether, propylene glycol dimethyl ether, propylene glycol diethyl ether, diethylene glycol dimethyl ether, diethylene glycol diethyl ether and diethylene glycol dibutyl ether; diisopentyl ether, diisobutyl ether, dioxane, tetrahydrofuran, anisole, perfluoro-2-butyltetrahydrofuran, perfluorotetrahydrofuran, 1,4-dioxane and the like.

Examples of the amide-based solvents include N-methyl-2-pyrrolidone, N,N-dimethylacetamide, N,N-dimethylformamide, hexamethylphosphoric triamide, 1,3-dimethyl-2-imidazolidinone and the like.

Examples of the glycol-based solvents include ethylene glycol, diethylene glycol, propylene glycol, polyethylene glycol, polypropylene glycol and the like.

Examples of the sulfur-containing compound-based solvents include dimethyl sulfoxide, diethyl sulfoxide, dipropyl sulfoxide, sulfolane and the like.

Examples of the hydrocarbon-based solvents include aliphatic hydrocarbon-based solvents such as pentane, hexane, octane, decane, 2,2,4-trimethylpentane, 2,2,3-trimethylhexane, perfluorohexane, perfluoroheptane, limonene and pinene; aromatic hydrocarbon-based solvents such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene and dipropylbenzene.

1.6. Other Components

The composition for semiconductor processing according to the present embodiment may contain, aside from the above-described components, necessary components as appropriate depending on the intended use of a processing agent such as cleaning, etching or resist removal. Examples of such components include a water-soluble polymer, an organic acid, a pH adjuster, a surfactant, a nitrogen-containing heterocyclic compound and the like.

1.6.1. Water-Soluble Polymer

The composition for semiconductor processing according to the present embodiment may contain a water-soluble polymer. When contained, since the water-soluble polymer is adsorbed to the surface of an object to be processed to form a coating, there are cases where the corrosion of the object to be processed can be further reduced. As described above, "being water-soluble" in the present specification refers to the fact that the mass of a substance that dissolves in 100 g of water at 20° C. is 0.1 g or more.

Examples of the water-soluble polymer include polyacrylic acid, polymethacrylic acid, polymaleic acid, polyvinylsulfonic acid, polyallylsulfonic acid, polystyrenesulfonic acid, and salts thereof, copolymers of a monomer such as styrene, α-methylstyrene or 4-methylstyrene and an acid monomer such as (meth)acrylic acid or maleic acid, polymers having a repeating unit containing an aromatic hydrocarbon group obtained by condensing benzenesulfonic acid, naphthalenesulfonic acid or the like with formalin, and salts thereof; vinyl-based synthetic polymers such as polyvinyl alcohol, polyoxyethylene, polyvinylpyrrolidone, polyvinylpyridine, polyacrylamide, polyvinylformamide, polyethyleneimine, polyvinyloxazoline, polyvinylimidazole and polyallylamine; denatured products of natural polysaccharides such as hydroxyethylcellulose, carboxymethylcellulose and modified starch; and the like. These water-soluble polymers may be used singly or two or more thereof may be used in combination.

The weight-average molecular weight (Mw) of the water-soluble polymer that can be used in the present embodiment is preferably 1,000 or more and 1,500,000 or less and more preferably 3,000 or more and 1,200,000 or less. "Weight-average molecular weight" in the present specification refers to the polyethylene glycol-equivalent weight-average molecular weight measured by gel permeation chromatography (GPC).

The content proportion of the water-soluble polymer is preferably adjusted so that the viscosity of the composition for semiconductor processing at normal temperature reaches 2 mPa·s or lower. When the viscosity of the composition for semiconductor processing at normal temperature exceeds 2 mPa·s, there are cases where the viscosity becoming too high makes it impossible to stably supply the composition for semiconductor processing to an object to be processed. The viscosity of the composition for semiconductor processing is affected by the weight-average molecular weight or content of the water-soluble polymer to be added and is thus preferably adjusted in consideration of the balance therewith.

1.6.2. Organic Acid

The composition for semiconductor processing according to the present embodiment may contain an organic acid. "Organic acid" in the present specification does not include the above-described water-soluble polymer (for example, polyacrylic acid, polymethacrylic acid and the like). Among organic acids, a compound represented by the following general formula (3) can be preferably used.

[Chem. 1]

(3)

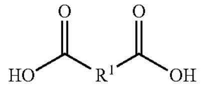

(In the general formula (3), $R^1$ represents an organic group having 1 to 20 carbon atoms.)

Examples of the organic group having 1 to 20 carbon atoms as $R^1$ in the general formula (3) include an organic group having 1 to 20 carbon atoms and having a saturated aliphatic hydrocarbon group, an organic group having 1 to 20 carbon atoms and having an unsaturated aliphatic hydrocarbon group, an organic group having 3 to 20 carbon atoms and having a cyclic saturated hydrocarbon group, an organic group having 6 to 20 carbon atoms and having an unsaturated cyclic hydrocarbon group, a hydrocarbon group having 1 to 20 carbon atoms and having a carboxyl group, a hydrocarbon group having 1 to 20 carbon atoms and having a hydroxyl group, a hydrocarbon group having 1 to 20 carbon atoms and having both a carboxyl group and a hydroxyl group, a hydrocarbon group having 1 to 20 carbon atoms and having an amino group, a hydrocarbon group having 1 to 20 carbon atoms and having both an amino group and a carboxyl group, an organic group having 1 to 20 carbon atoms and having a heterocyclic group and the like. Among these, an organic group having 1 to 20 carbon atoms and having a saturated aliphatic hydrocarbon group, an organic group having 1 to 20 carbon atoms and having an unsaturated aliphatic hydrocarbon group, a hydrocarbon group having 1 to 20 carbon atoms and having an amino group, a hydrocarbon group having 1 to 20 carbon atoms and having a carboxyl group and an organic group having 6 to 20 carbon atoms and having an aryl group are preferable.

Specific examples of the compound represented by the general formula (3) include citric acid, malonic acid, maleic acid, tartaric acid, malic acid, succinic acid, phthalic acid, glutamic acid, aspartic acid, ethylenediaminetetraacetic acid, diethylenetriaminepentaacetic acid, iminodiacetic acid and the like. Among these, at least one selected from the group consisting of citric acid, malonic acid, maleic acid, tartaric acid, malic acid and succinic acid is preferable, at least one selected from the group consisting of citric acid, malonic acid and malic acid is more preferable and at least one selected from the group consisting of citric acid and malonic acid is particularly preferable. There are cases where the compound represented by the general formula (3) is capable of effectively reducing or removing a contaminant. The compound represented by the general formula (3) may be used singly or two or more may be used in combination.

In addition, among the organic acids, it is also preferable to use a compound having a zwitterionic structure represented by the following general formula (4). Here, the zwitterionic structure refers to a compound having one or more functional groups capable of having a positive charge in the composition for semiconductor processing and one or more functional groups capable of having a negative charge in composition for semiconductor processing in the same molecule. Examples thereof include inner salt compounds having a functional group for generating a positive charge, such as an ammonium cation, in the composition for semiconductor processing and a functional group for generating a negative charge, such as a carboxylate anion, in the same molecule.

[Chem. 2]

(4)

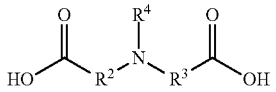

In the formula (4), $R^2$ and $R^3$ each independently represent a substituted or unsubstituted alkanediyl group having 1 to 6 carbon atoms and are preferably a substituted or unsubstituted alkanediyl group having 1 to 4 carbon atoms and more preferably a substituted or unsubstituted alkanediyl group having 1 or 2 carbon atoms. $R^4$ represents a substituted or unsubstituted alkyl group having 12 to 18 carbon atoms.

The compound represented by the general formula (4) has carboxyl groups at both ends of the molecule. A compound having such a structure has a high coordination ability with respect to a metal ion and is thus capable of effectively suppressing the excessive progress of etching of a metal wiring material or the like in some cases.

The content of the organic acid is preferably 0.0001 mass % or more and 1 mass % or less and more preferably 0.0005 mass % or more and 0.5 mass % or less when the total mass of the composition for semiconductor processing is set to 100 mass %. When the content of the organic acid is within the above-described range, there are cases where it is possible to effectively remove a contaminant. In addition, there are cases where the excessive progress of etching is more effectively suppressed and a favorable object to be processed can be obtained.

1.6.3. pH Adjuster

The lower limit value of the pH of the composition for semiconductor processing according to the present embodiment is preferably 9 and more preferably 10, and the upper limit value of the pH is preferably 14. In the case of the composition for semiconductor processing for processing an object to be processed containing tungsten as a wiring material, the lower limit value of the pH is preferably 2, and the upper limit value of the pH is preferably 7 and more preferably 6.

In a case where a desired pH cannot be obtained in the composition for semiconductor processing according to the present embodiment, a pH adjuster may be separately added thereto to adjust the pH to be within the above-described range. Examples of the pH adjuster include inorganic acids such as hydrochloric acid, nitric acid, sulfuric acid and phosphoric acid; alkali metal hydroxides such as sodium hydroxide, potassium hydroxide, rubidium hydroxide and cesium hydroxide; basic compounds such as ammonia. These pH adjusters may be used singly or two or more thereof may be used in combination.

In the disclosure, pH refers to the hydrogen ion index, and the value thereof can be measured under conditions of 25° C. and 1 atmosphere using a commercially available pH meter (for example, manufactured by Horiba, Ltd., benchtop type pH meter).

1.6.4. Surfactant

The composition for semiconductor processing according to the present embodiment may contain a surfactant. As the surfactant, it is possible to preferably use a nonionic surfactant or an ionic surfactant. Addition of the surfactant enhances an effect of removing particles or a metal impurity contained in a CMP slurry from a semiconductor substrate and makes it possible to obtain a more favorable object to be processed in some cases.

Examples of the nonionic surfactant include polyoxyethylene alkyl ethers such as polyoxyethylene lauryl ether, polyoxyethylene cetyl ether, polyoxyethylene stearyl ether and polyoxyethylene oleyl ether; polyoxyethylene aryl ethers such as polyoxyethylene octylphenyl ether and polyoxyethylene nonylphenyl ether; sorbitan fatty acid esters such as sorbitan monolaurate, sorbitan monopalmitate and sorbitan monostearate; polyoxyethylene sorbitan fatty acid esters such as polyoxyethylene sorbitan monolaurate, polyoxyethylene sorbitan monopalmitate and polyoxyethylene sorbitan monostearate; and the like. The above-exemplified nonionic surfactants may be used singly or two or more thereof may be used in combination.

Examples of the anionic surfactant include alkylbenzenesulfonic acids such as dodecylbenzenesulfonic acid; alkylnaphthalenesulfonic acids; alkyl sulfate esters such as lauryl sulfate; sulfuric acid esters of polyoxyethylene alkyl ether such as polyoxyethylene lauryl sulfate; naphthalenesulfonic acid condensates; alkyliminodicarboxylic acid; lignosulfonic acid; and the like. These anionic surfactants may be used in a salt form. In this case, examples of a counter cation include a sodium ion, a potassium ion, an ammonium ion and the like, and an ammonium ion is preferable from the viewpoint of preventing calcium or sodium from being excessively contained.

The content of the surfactant is preferably 0.001 mass % or more and 1 mass % or less and more preferably 0.005 mass % or more and 0.5 mass % or less when the total mass of the composition for semiconductor processing is set to 100 mass %.

1.6.5. Nitrogen-Containing Heterocyclic Compound

The composition for semiconductor processing according to the present embodiment may contain a nitrogen-containing heterocyclic compound. The nitrogen-containing heterocyclic compound is an organic compound having at least one nitrogen atom and including at least one heterocycle selected from a five-membered heterocycle and a six-membered heterocycle. Specific examples of the heterocycle include five-membered heterocycles such as a pyrrole structure, an imidazole structure and a triazole structure; six-membered heterocycles such as a pyridine structure, a pyrimidine structure, a pyridazine structure and a pyrazine structure. The heterocycle may form a condensed ring. Specific examples thereof include an indole structure, an isoindole structure, a benzimidazole structure, a benzotriazole structure, a quinoline structure, an isoquinoline structure, a quinazoline structure, a cinnoline structure, a phthalazine structure, a quinoxaline structure, an acridine structure and the like. Among heterocyclic compounds having such a structure, heterocyclic compounds having a pyridine structure, a quinoline structure, a benzimidazole structure or a benzotriazole structure are preferable.

Specific examples of the nitrogen-containing heterocyclic compound include aziridine, pyridine, pyrimidine, pyrrolidine, pyrazine, triazine, pyrrole, imidazole, indole, quinoline, isoquinoline, benzoisoquinoline, purine, pteridine, triazole, triazolidine, benzotriazole, carboxybenzotriazole, 1,2-benzisothiazolin-3-one, 2-methyl-4,5-trimethylene-4-isothiazolin-3-one, 2-methyl-4-isothiazolin-3-one, 5-chloro-2-methyl-4-isothiazolin-3-one, N-n-butyl-1,2-benzisothiazolin-3-one, 2-n-octyl-4-isothiazolin-3-one, 4,5-dichloro-2-n-octyl-4-isothiazolin-3-one, and derivatives having these skeleton. Among these, at least one selected from the group consisting of benzotriazole and triazole is preferable. These nitrogen-containing heterocyclic compounds may be used singly or two or more silicone compounds may be used in combination.

1.7. Method for Preparing Composition for Semiconductor Processing

The composition for semiconductor processing according to the present embodiment is not particularly limited and can be prepared by a well-known method. Specifically, the composition can be prepared by dissolving each of the above-described components in a liquid medium such as water or an organic solvent and filtering the components. There are no particular limitations on the order or method for mixing each of the above-described components.

In a method for preparing the composition for semiconductor processing according to the present embodiment, it is preferable to control the amount of particles by filtration with a depth or pleated filter. Here, the depth filter refers to a high-precision filtration filter which is also called a depth filtration or volumetric filtration filter. As such a depth filter, there is a filter forming a laminate structure in which filtration membranes having a number of holes are laminated or a filter in which a fiber bundle is wound. Specific examples of the depth filter include PROFILE II, NEXIS NXA, NEXIS NXT, POLY-FINE XLD, ULTIPLEAT PROFILE and the like (all manufactured by Nihon Pall Ltd.), depth cartridge filters, wind cartridge filters and the like (all manufactured by Advantec Co., Ltd.), CP filters, BM filters and the like (all manufactured by Chisso Corporation), SLOPE-PURE, DIA, MICRO-CILIA and the like (all manufactured by Roki Techno Co., Ltd.) and the like.

Examples of the pleated filter include tubular high-precision filtration filters obtained by folding a precision filtration membrane sheet composed of non-woven fabric, filter paper, metal mesh and the like, molding the precision filtration membrane sheet in a tubular shape and liquid-tightly sealing both ends of the tube. Specific examples thereof include HDCII, POLY-FINE II and the like (all manufactured by Nihon Pall Ltd.), PP pleated cartridge filters (manufactured by Advantec Co., Ltd.), POROUS FINE (manufactured by Chisso Corporation), CERTAIN-PORE, MICRO-PURE and the like (all manufactured by Roki Techno Co., Ltd.).

2. Processing Agent

As described above, each user is able to prepare a processing agent by diluting the concentrated type composition for semiconductor processing with a liquid medium or able to use the undiluted type composition for semiconductor processing as a processing agent as it is. In addition, the processing agent can be used as a cleaning agent for cleaning the surfaces of semiconductor substrates, a resist removing agent or an etching agent.

Here, the liquid medium that is used for dilution is the same meaning as the liquid medium that is contained in the composition for semiconductor processing and can be selected from the above-exemplified liquid media as appropriate depending on the kind of the processing agent.

As a method for diluting the concentrated type composition for semiconductor processing by adding the liquid medium thereto, there is a method in which a pipe for supplying the concentrated type composition for semiconductor processing and a pipe for supplying the liquid medium are joined together to mix the composition and the liquid medium and this mixed processing agent is supplied to a surface to be processed. For this mixing, it is possible to adopt a method that is normally performed such as a method in which the liquids are caused to collide and mix with each other through a narrow path in a pressurized state; a method in which an infill, such as a glass tube, is packed into a pipe and the flows of the liquids are repeatedly separated from each other and joined together; a method in which a blade that is rotated by power is provided in the pipe.

In addition, as another method for diluting the concentrated type composition for semiconductor processing by adding the liquid medium thereto, there is a method in which a pipe for supplying the concentrated type composition for semiconductor processing and a pipe for supplying the liquid medium are independently provided, a predetermined amount of the liquid is supplied to a surface to be processed from each pipe, and the liquids are mixed on the surface to be processed. Furthermore, as still another method for diluting the concentrated type composition for semiconductor processing by adding the liquid medium thereto, there is a method in which a predetermined amount of the concentrated type composition for semiconductor processing and a predetermined amount of the liquid medium are put into and mixed together in one container and then the mixed processing agent is supplied to a surface to be processed.

Regarding the dilution ration at the time of diluting the concentrated type composition for semiconductor processing by adding the liquid medium thereto, 1 part by mass of the concentrated type composition for semiconductor processing is preferably diluted to 1 to 500 parts by mass (1 to 500 times), more preferably diluted to 20 to 500 parts by mass (20 to 500 times) and particularly preferably diluted to 30 to 300 parts by mass (30 to 300 times) by adding the liquid medium thereto. The composition for semiconductor processing is preferably diluted with the same liquid medium as the liquid medium that is contained in the composition for semiconductor processing. When the composition for semiconductor processing is put into a concentrated state as described above, transportation or storage in a smaller container becomes possible compared with a case where the processing agent is transported and stored as it is. As a result, it is possible to reduce the transportation or storage cost. In addition, the amount of the processing agent to be purified becomes smaller than that in a case where the processing agent is purified by filtration or the like as it is, which makes it possible to shorten the purification time and thereby makes mass production possible.

3. Processing Method

A processing method according to the present embodiment includes a step of processing a semiconductor substrate using the composition for semiconductor processing. The processing method according to the present embodiment can be preferably used particularly at the time of removing a photoresist including a negative type photoresist and a positive type photoresist.

In a case where the composition for semiconductor processing according to the present embodiment is used to remove a photoresist, the following two aspects of use can be exemplified. The first aspect is a case where a photoresist pattern obtained by a lithography method is formed, a conductive metal film or an interlayer film is selectively etched using the photoresist pattern as a mask to form a fine circuit, and the photoresist pattern is removed. The second aspect is a case where a plasma ashing process is performed on a photoresist pattern after an etching step and a residue (a photoresist denatured film, a metal deposition or the like) after the plasma ashing is removed.

The method for removing a photoresist may include, for example, (I) a step of providing a photoresist layer on a semiconductor substrate, (II) a step of bringing the semiconductor substrate and the composition for semiconductor processing into contact with each other, and (III) a step of processing the semiconductor substrate with a rinse liquid.

As the semiconductor substrate that is used in the step (II), for example, a semiconductor substrate on which a metal wiring is formed or a semiconductor substrate on which a metal wiring and an interlayer film are formed can be used. In this case, as the metal wiring, for example, an aluminum (Al)-based wiring, a copper (Cu)-based wiring and the like can be exemplified. In addition, as the interlayer film, for example, an insulating film such as an organic SOG film, a low dielectric film and the like can be exemplified.

Examples of the photoresist that is used in the step (I) include (i) a positive type photoresist containing a naphthoquinone diazide compound and a novolac resin, (ii) a positive type photoresist containing a compound that generates an acid when exposed to light, a compound that is decomposed by an acid and becomes more soluble in alkali aqueous solutions and an alkali-soluble resin, (iii) a positive type photoresist containing a compound that generates an acid when exposed to light and an alkali-soluble resin having a group that is decomposed by an acid and becomes more soluble in alkali aqueous solutions, (iv) a negative type photoresist containing a compound that generates an acid when exposed to light, a crosslinking agent and an alkali-soluble resin and the like.

In the step (II), the composition for semiconductor processing is preferably brought into contact with the semiconductor substrate by being put into a tank having a temperature adjustment function, held at a certain temperature and dropped or sprayed from the tip of a nozzle.

In the step (II), the supply temperature of the composition for semiconductor processing is preferably 65° C. or lower and more preferably 60° C. or lower. In addition, the supply temperature is preferably 25° C. or higher and more preferably 30° C. or higher.

In the step (II), as a method for bringing the composition for semiconductor processing and the semiconductor substrate into contact with each other, it is possible to perform a well-known method such as an immersion method, a shower method or a paddle method, and it is preferable that the semiconductor substrate is fixed onto a rotatable table and brought into contact with the composition for semiconductor processing while being rotated. In this case, the rotation speed of the semiconductor substrate is preferably 1000 rpm or slower and more preferably 800 rpm or slower. In addition, the rotation speed is preferably 300 rpm or faster and more preferably 400 rpm or faster.

In the step (II), in a case where the semiconductor substrate is fixed onto a rotatable table and brought into contact with the composition for semiconductor processing while being rotated, the supply rate of the composition for semiconductor processing is preferably 1500 mL/minute or slower and more preferably 1000 mL/minute or slower. The supply rate is preferably 500 mL/minute or faster and more preferably 600 mL/minute or faster. Furthermore, within the above-described supply rate range, the supply time of the composition for semiconductor processing is preferably 300 seconds or shorter and more preferably 200 seconds or shorter. In addition, the supply time is preferably 30 seconds or longer and more preferably 40 seconds or longer.

When the composition for semiconductor processing and the semiconductor substrate are brought into contact with each other under the above-described conditions, it is possible to effectively develop the removal of the photoresist, the removal of the residue after the ashing process and the corrosion prevention of the semiconductor substrate. Particularly, in the case of removing a residue (a photoresist denatured film, a metal deposition or the like) after the plasma ashing process, a photoresist residue (photoresist denatured film) or a metal deposition generated during the etching of the metal film is attached to and remains on the surface of the semiconductor substrate as a residue after plasma ashing. When this residue is brought into contact with the composition for semiconductor processing, it is possible to effectively remove the residue on the semiconductor substrate. Plasma ashing is a method for removing a photoresist pattern, but plasma ashing often allows a part of the photoresist pattern to remain as a denatured film, and the processing method according to the present embodiment is particularly effective for completely removing the photoresist denatured film in such a case.

Examples of the rinse liquid that is used in the step (III) include pure water, organic solvents such as lower alcohols and the like. In addition, after the semiconductor substrate is processed with the rinse liquid, a drying process may be performed thereon.

4. Examples

Hereinafter, the disclosure will be described using examples, but the disclosure is not limited to these examples by any means. "Parts" and "%" in the present examples are mass-based unless particularly otherwise described.

4.1. Preparation of Composition for Semiconductor Processing

Each component shown in Table 1 below or Table 2 below was injected into a polyethylene container and stirred for five minutes, thereby obtaining a composition for semiconductor processing of each of Examples 1 to 9 and Comparative Examples 1 to 9.

4.2. Evaluation Methods

<Color Change Evaluation>

A color change was evaluated by measuring the APHA color (Hazen scale) using a PFXi-195/1 type colorimeter manufactured by Tintometer GmbH immediately after the above-obtained composition for semiconductor processing was prepared and after the composition for semiconductor processing was stored at 60° C. for seven days. The color change can be used as an index of component denaturing by storage, and a case where the color change after the storage at 60° C. for seven days compared with immediately after the preparation is smaller is preferable.

<Resist Removal Characteristic Evaluation>

A silicon wafer including a copper wiring (manufactured by Advantec Co., Ltd., product type ADV-3CMP754) was placed on a CMP device (manufactured by Applied Materials, Inc., model No. "Reflexon LK CMP"), CMP was performed to remove a copper layer excessively laminated on the wafer surface, whereby the silicon wafer was processed such that the copper wiring was exposed on the surface. As the conditions of the CMP device, the platen rotation speed was set to 90 rpm, the polishing pad rotation speed was set to 72 rpm, the polishing pad pressure was set to 3 psi, the slurry flow rate was set to 150 mL/minute, and the processing time was set to 100 seconds. As a CMP slurry, product name CMS7501 manufactured by JSR Corporation was used. As a CMP pad, product name CMP7305-fpj manufactured by JSR Corporation was used.

A photoresist (manufactured by JSR Corporation, product name "ARX-3917") was applied onto the surface of this chemical mechanical-polished wafer at 1000 rpm using a spin coater and then heated at 100° C. for one minute using a hot plate, thereby obtaining a film having a thickness of 100 nm. A resist-applied silicon wafer produced as described above was used as an evaluation wafer.

The obtained evaluation wafer was placed on a single wafer cleaning device "CELLESTA™_i" manufactured by Tokyo Electron Limited., and the evaluation wafer was processed according to processing conditions and each composition for semiconductor processing shown in Table 1 below or Table 2 below. Furthermore, while the evaluation wafer was rotated at 800 rpm, ultrapure water (25° C.) was dropped thereon at 1200 mL/minute for 60 seconds, and, in the end, the evaluation wafer was rotated at 1000 rpm for 30 seconds in a state where nothing was dropped thereon to shake and dry a liquid film on the surface.

The status of resist removal on the dried evaluation wafer was visually observed. Incidentally, the above-obtained composition for semiconductor processing was placed still and stored in a constant temperature storage tank (60° C.) for seven days, and the status of resist removal was observed in the same manner using the evaluation wafer. Evaluation standards are as described below. The evaluation results are shown in Table 1 below and Table 2 below.

(Evaluation Standards)

A: No resist film remains, and the removal result is favorable enough for the wafer to be practically used.

B: Some of a resist film remains, and the removal result is slightly poor that the wafer cannot be practically used.

C: A resist film clearly remains, and the removal result is so poor that the wafer cannot be practically used.

4.3. Evaluation Results

Table 1 below or Table 2 below shows the compositions of the compositions for semiconductor processing, the processing conditions and the evaluation results.

TABLE 1

| | | | Example 1 | Example 2 | Example 3 | Example 4 | Example 5 |
|---|---|---|---|---|---|---|---|
| Composition for semiconductor processing | (A) component | Kind | Diethylhydroxyl amine | Diethylhydroxyl amine | Diethylhydroxyl amine | Diethylhydroxyl amine | Diethylhydroxyl amine |
| | | $M_A$ (mass %) | 5 | 2.5 | 10 | 5 | 5 |
| | (B) component | Kind | Diethylamine | Diethylamine | Diethylamine | Diethylamine | Diethylamine |
| | | $M_B$ (mass %) | 0.005 | 0.002 | 0.009 | 0.03 | 0.0006 |
| | (C) component | Kind | Monoethanolamine | Monoethanolamine | Monoethanolamine | Monoethanolamine | Monoethanolamine |
| | | $M_C$ (mass %) | 2.0 | 2.0 | 4.0 | 2.0 | 2.0 |
| | (D) component | Kind | Diethylene glycol monobutyl ether | Diethylene glycol monobutyl ether | Diethylene glycol monobutyl ether | Diethylene glycol monobutyl ether | Diethylene glycol monobutyl ether |
| | | (mass %) | 55 | 65 | 65 | 65 | 65 |
| | | Kind | | | | | |
| | | (mass %) | | | | | |
| | | Kind | Water | Water | Water | Water | Water |
| | | (mass %) | Remainder | Remainder | Remainder | Remainder | Remainder |
| | $M_A/M_B$ | | $1.0 \times 10^3$ | $1.3 \times 10^3$ | $1.1 \times 10^3$ | $1.7 \times 10^2$ | $8.3 \times 10^3$ |
| | Other additives | Kind | 5-Methyl-1H-benzotriazole | 5-Methyl-1H-benzotriazole | 5-Methyl-1H-benzotriazole | Benzotriazole | Benzotriazole |
| | | (mass %) | 0.05 | 0.05 | 0.05 | 0.10 | 0.10 |
| Processing conditions | Supply temperature of composition for semiconductor processing (° C.) | | 55 | 40 | 60 | 60 | 60 |
| | Rotation speed of substrate to be processed (rpm) | | 400 | 300 | 1000 | 1000 | 800 |
| | Supply rate of composition for semiconductor processing (mL/min.) | | 800 | 500 | 900 | 1000 | 800 |
| | Supply time of composition for semiconductor processing (sec.) | | 60 | 120 | 90 | 100 | 60 |
| Evaluation items | Color change | Immediately after preparation | 10 | 10 | 10 | 10 | 10 |
| | | After storage at 60° C. for seven days | 20 | 20 | 20 | 20 | 10 |
| | Resist removal characteristics | Immediately after preparation | A | A | A | A | A |
| | | After storage at 60° C. for seven days | A | A | A | A | A |

| | | | Example 6 | Example 7 | Example 8 | Example 9 |
|---|---|---|---|---|---|---|
| Composition for semiconductor processing | (A) component | Kind | Diethylhydroxylamine | Diethylhydroxylamine | Diethylhydroxylamine | Diethylhydroxylamine |
| | | $M_A$ (mass %) | 5 | 5 | 5 | 5 |
| | (B) component | Kind | Diethylamine | Diethylamine | Diethylamine | Diethylamine |
| | | $M_B$ (mass %) | 0.005 | 0.002 | 0.002 | 0.002 |
| | (C) component | Kind | Monoisopropanolamine | Monoisopropanolamine | Monoisopropanolamine | Monoisopropanolamine |
| | | $M_C$ (mass %) | 2.0 | 4.0 | 4.0 | 4.0 |

TABLE 1-continued

| | | | | | | |
|---|---|---|---|---|---|---|
| | (D) component | Kind | Diethylene glycol monobutyl ether | Sulfolane | Diethylene glycol monobutyl ether | Cyclohexanone |
| | | (mass %) | 65 | 60 | 45 | 60 |
| | | Kind | | | Propylene glycol | |
| | | (mass %) | | | 20 | |
| | | Kind | Water | Water | Water | Water |
| | | (mass %) | Remainder | Remainder | Remainder | Remainder |
| | $M_A/M_B$ | | $1.0 \times 10^3$ | $2.5 \times 10^3$ | $2.5 \times 10^3$ | $2.5 \times 10^3$ |
| | Other additives | Kind | 1,2,4-triazole | 5-Methyl-1H-benzotriazole | Benzotriazole | 5-Methyl-1H-benzotriazole |
| | | (mass %) | 0.10 | 0.10 | 0.10 | 0.10 |
| Processing conditions | Supply temperature of composition for semiconductor processing (° C.) | | 60 | 55 | 55 | 60 |
| | Rotation speed of substrate to be processed (rpm) | | 800 | 1000 | 1000 | 700 |
| | Supply rate of composition for semiconductor processing (mL/min.) | | 800 | 1000 | 1000 | 700 |
| | Supply time of composition for semiconductor processing (sec.) | | 60 | 120 | 120 | 60 |
| Evaluation items | Color change | Immediately after preparation | 10 | 10 | 10 | 10 |
| | | After storage at 60° C. for seven days | 20 | 20 | 20 | 20 |
| | Resist removal characteristics | Immediately after preparation | A | A | A | A |
| | | After storage at 60° C. for seven days | A | A | A | A |

TABLE 2

| | | | Comparative Example 1 | Comparative Example 2 | Comparative Example 3 | Comparative Example 4 | Comparative Example 5 |
|---|---|---|---|---|---|---|---|
| Composition for semiconductor processing | (A) component | Kind | Diethylhydroxylamine | Diethylhydroxylamine | Diethylhydroxylamine | Diethylhydroxylamine | Diethylhydroxylamine |
| | | $M_A$ (mass %) | 5 | 2.5 | 5 | 5 | 5 |
| | (B) component | Kind | — | Diethylamine | Diethylamine | Diethylamine | Diethylamine |
| | | $M_B$ (mass %) | 0 | 0.2 | 0.00005 | 0.2 | 0.005 |
| | (C) component | Kind | Monoethanolamine | Monoethanolamine | Monoethanolamine | Monoethanolamine | — |
| | | $M_C$ (mass %) | 2.0 | 2.0 | 2.0 | 2.0 | 0 |
| | (D) component | Kind | Diethylene glycol monobutyl ether | Diethylene glycol monobutyl ether | Diethylene glycol monobutyl ether | Propylene glycol monobutyl ether | Diethylene glycol monobutyl ether |
| | | (mass %) | 65 | 65 | 65 | 65 | 65 |
| | | Kind | | | | Propylene glycol | |
| | | (mass %) | | | | 30 | |
| | | Kind | Water | Water | Water | Water | Water |
| | | (mass %) | Remainder | Remainder | Remainder | Remainder | Remainder |
| | $M_A/M_B$ | | — | $1.3 \times 10^1$ | $1.0 \times 10^5$ | $2.5 \times 10^1$ | $1.0 \times 10^3$ |
| | Other additives | Kind (mass %) | Benzotriazole 0.01 | Benzotriazole 0.01 | Benzotriazole 0.01 | Benzotriazole 0.01 | Benzotriazole 0.01 |

TABLE 2-continued

| | | | | | | | |
|---|---|---|---|---|---|---|---|
| Processing conditions | Supply temperature of composition for semiconductor processing (° C.) | | 65 | 60 | 65 | 60 | 60 |
| | Rotation speed of substrate to be processed (rpm) | | 700 | 1000 | 700 | 1000 | 1000 |
| | Supply rate of composition for semiconductor processing (mL/min.) | | 700 | 700 | 700 | 700 | 1600 |
| | Supply time of composition for semiconductor processing (sec.) | | 60 | 90 | 90 | 90 | 90 |
| Evaluation items | Color change | Immediately after preparation | 10 | 10 | 10 | 10 | 10 |
| | | After storage at 60° C. for seven days | 50 | 50 | 50 | 40 | 20 |
| | Resist removal characteristics | Immediately after preparation | A | A | A | A | C |
| | | After storage at 60° C. for seven days | C | C | C | B | C |

| | | | Comparative Example 6 | Comparative Example 7 | Comparative Example 8 | Comparative Example 9 |
|---|---|---|---|---|---|---|
| Composition for semiconductor processing | (A) component | Kind | Diethylhydroxylamine | Diethylhydroxylamine | Diethylhydroxylamine | Diethylhydroxylamine |
| | | $M_A$ (mass %) | 2.5 | 5 | 5 | 5 |
| | (B) component | Kind | Diethylamine | Diethylamine | Diethylamine | Diethylamine |
| | | $M_B$ (mass %) | 0.2 | 0.00005 | 0.2 | 0.005 |
| | (C) component | Kind | Monoethanolamine | Monoethanolamine | Monoethanolamine | — |
| | | $M_C$ (mass %) | 2.0 | 2.0 | 4.0 | 0 |
| | (D) component | Kind | Diethylene glycol monobutyl ether | Diethylene glycol monobutyl ether | Propylene glycol monobutyl ether | Diethylene glycol monobutyl ether |
| | | (mass %) | 65 | 60 | 65 | 65 |
| | | Kind | | | Propylene glycol | |
| | | (mass %) | | | 30 | |
| | | Kind | Water | Water | Water | Water |
| | | (mass %) | Remainder | Remainder | Remainder | Remainder |
| | $M_A/M_B$ | | $1.3 \times 10^1$ | $1.0 \times 10^5$ | $2.5 \times 10^1$ | $1.0 \times 10^3$ |
| | Other additives | Kind (mass %) | Benzotriazole 0.01 | Benzotriazole 0.01 | Benzotriazole 0.01 | Benzotriazole 0.01 |
| Processing conditions | Supply temperature of composition for semiconductor processing (° C.) | | 20 | 60 | 65 | 60 |
| | Rotation speed of substrate to be processed (rpm) | | 700 | 200 | 700 | 1100 |
| | Supply rate of composition for semiconductor processing (mL/min.) | | 700 | 700 | 300 | 700 |
| | Supply time of composition for semiconductor processing (sec.) | | 500 | 90 | 90 | 20 |

TABLE 2-continued

| | | | | | | |
|---|---|---|---|---|---|---|
| Evaluation items | Color change | Immediately after preparation | 10 | 10 | 10 | 10 |
| | | After storage at 60° C. for seven days | 50 | 50 | 40 | 20 |
| | Resist removal characteristics | Immediately after preparation | A | A | A | C |
| | | After storage at 60° C. for seven days | C | C | B | C |

In Table 1 and Table 2, the units of numerical values for each component are "mass %." In each example and each comparative example, the total amount of the individual components reaches 100 mass %, and the remainder is ion exchange water. Here, each component in Table 1 or Table 2 will be complementarily described.

<(A) Component>

Diethylhydroxylamine: manufactured by ADEKA Corporation, trade name "DEHA 100%"

<(B) Component>

Diethylamine: manufactured by Tokyo Chemical Industry Co., Ltd., trade name "Diethylamine"

<(C) Component>

Monoethanolamine: manufactured by Tokyo Chemical Industry Co., Ltd., trade name "2-Aminoethanol"

Monoisopropanolamine: manufactured by FUJIFILM Wako Pure Chemical Corporation, trade name "(±)-1-amino-2-propanol"

<(D) Component>

Diethylene glycol monobutyl ether: manufactured by Nippon Nyukazai Co., Ltd., trade name "BDG"

Propylene glycol monomethyl ether: manufactured by FUJIFILM Wako Pure Chemical Corporation, trade name "1-methoxy-2-propanol"

Sulfolane: manufactured by Sumitomo Seika Chemicals Co., Ltd., trade name "Sulfolane"

Propylene glycol: manufactured by FUJIFILM Wako Pure Chemical Corporation, trade name "Propylene glycol"

Cyclohexanone: manufactured by FUJIFILM Wako Pure Chemical Corporation, trade name "Cyclohexanone"

<Other Additives (Nitrogen-Containing Heterocyclic Compound)>

Benzotriazole: manufactured by Tokyo Chemical Industry Co., Ltd., trade name "1,2,3-Benzotriazole"

1,2,4-triazole: manufactured by Tokyo Chemical Industry Co., Ltd., trade name "1,2,4-Triazole"

5-Methyl-1H-benzotriazole: manufactured by Tokyo Chemical Industry Co., Ltd., trade name "5-Methyl-1H-benzotriazole"

As shown in Table 1, the resist removal characteristics of the compositions for semiconductor processing for which the ratio $M_A/M_B$ of the content $M_A$ [mass %] of the (A) component to the content $M_B$ [mass %] of the (B) component was $1.0\times10^2$ to $1.0\times10^4$ were favorable. In addition, for the compositions for semiconductor processing of Examples 1 to 9, the results were favorable regarding the resist removal characteristics after storage at 60° C. for seven days.

On the other hand, as in the composition for semiconductor processing of Comparative Example 1, it was clear that, in a case where the (B) component was not contained, the resist removal characteristics after storage at 60° C. for seven days were poor and the storage stability was poor. As in the compositions for semiconductor processing of Comparative Examples 2, 4, 6 and 8, it was clear that, in a case where $M_A/M_B$ was less than $1.0\times10^2$, the resist removal characteristics after storage at 60° C. for seven days were poor and the storage stability was poor. As in the compositions for semiconductor processing of Comparative Examples 3 and 7, it was clear that, in a case where $M_A/M_B$ was more than $1.0\times10^4$, the resist removal characteristics after storage at 60° C. for seven days were poor and the storage stability was poor. As in the compositions for semiconductor processing of Comparative Examples 6 and 9, in a case where the (C) component was not contained, the resist removal characteristics were poor since immediately after preparation.

According to the results of Table 1 and Table 2, it was clear that, in the case of using the compositions for semiconductor processing for which $M_A/M_B$ was within a range of $1.0\times10^2$ to $1.0\times10^4$, it was possible to favorably satisfy both the resist removal characteristics immediately after manufacturing and the resist removal characteristics after storage at 60° C. for seven days.

The disclosure is not limited to the above-described embodiment and can be modified in a variety of manners. For example, the disclosure includes a configuration that is substantially the same as the configuration described in the embodiment (for example, a configuration having the same function, method and result or a configuration having the same objective and effect). In addition, the disclosure includes a configuration in which an inessential part of the configuration described in the above-described embodiment is substituted. In addition, the disclosure also includes a configuration exhibiting the same action and effect or a configuration capable of achieving the same objective as the configuration described in the above-described embodiment. In addition, the disclosure also includes a configuration obtained by adding a well-known technique to the configuration described in the embodiment.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A composition for semiconductor processing comprising:

(A) a compound represented by the following general formula (1);

(B) a compound represented by the following general formula (2);

(C) a compound having at least one functional group selected from the group consisting of an amino group and a salt thereof and a hydroxyl group, excluding the compound represented by the following general formula (1), a compound having a carboxyl group and a nitrogen-containing heterocyclic compound; and (D) a liquid medium, wherein, a content of the (A) component is indicated by $M_A$ [mass %] and a content of the (B) component is indicated by $M_B$ [mass %], and $M_A/M_B$ is $1.0\times10^2$ to $1.0\times10^4$, $$R_2N(OH) \quad (1)$$

$$R_2NH \quad (2)$$

and in the formula (1) and the formula (2), each R independently represents an alkyl group having 1 to 4 carbon atoms.

2. The composition for semiconductor processing according to claim 1, wherein the (C) component is at least one selected from the group consisting of methanolamine, ethanolamine, isopropanolamine and diethylethanolamine.

3. The composition for semiconductor processing according to claim 1, wherein the (D) component is an aqueous medium.

4. The composition for semiconductor processing according to claim 1, further comprising:

a nitrogen-containing heterocyclic compound.

5. A processing method comprising:

a step of processing a semiconductor substrate comprising contacting the composition for semiconductor processing according to claim 1 with the substrate.

6. A processing method comprising:

a step of processing a semiconductor substrate comprising contacting the composition for semiconductor processing according to claim 2 with the substrate.

7. A processing method comprising:

a step of processing a semiconductor substrate comprising contacting the composition for semiconductor processing according to claim 3 with the substrate.

8. A processing method comprising:

a step of processing a semiconductor substrate comprising contacting the composition for semiconductor processing according to claim 4 with the substrate.

9. A processing method comprising:

a step of supplying the composition for semiconductor processing according to claim 1 having a temperature of 25° C. or higher and 65° C. or lower while a semiconductor substrate is rotated at 300 rpm or faster and 1000 rpm or slower at a supply rate of the composition for semiconductor processing of 500 mL/minute or faster and 1500 mL/minute or slower for a supply time of the composition for semiconductor processing of 30 seconds or longer and 300 seconds or shorter to be brought into contact with the semiconductor substrate.

10. A processing method comprising:

a step of supplying the composition for semiconductor processing according to claim 2 having a temperature of 25° C. or higher and 65° C. or lower while a semiconductor substrate is rotated at 300 rpm or faster and 1000 rpm or slower at a supply rate of the composition for semiconductor processing of 500 mL/minute or faster and 1500 mL/minute or slower for a supply time of the composition for semiconductor processing of 30 seconds or longer and 300 seconds or shorter to be brought into contact with the semiconductor substrate.

11. A processing method comprising:

a step of supplying the composition for semiconductor processing according to claim 3 having a temperature of 25° C. or higher and 65° C. or lower while a semiconductor substrate is rotated at 300 rpm or faster and 1000 rpm or slower at a supply rate of the composition for semiconductor processing of 500 mL/minute or faster and 1500 mL/minute or slower for a supply time of the composition for semiconductor processing of 30 seconds or longer and 300 seconds or shorter to be brought into contact with the semiconductor substrate.

12. A processing method comprising:

a step of supplying the composition for semiconductor processing according to claim 4 having a temperature of 25° C. or higher and 65° C. or lower while a semiconductor substrate is rotated at 300 rpm or faster and 1000 rpm or slower at a supply rate of the composition for semiconductor processing of 500 mL/minute or faster and 1500 mL/minute or slower for a supply time of the composition for semiconductor processing of 30 seconds or longer and 300 seconds or shorter to be brought into contact with the semiconductor substrate.

* * * * *